United States Patent
Hovey et al.

(10) Patent No.: US 7,968,986 B2
(45) Date of Patent: Jun. 28, 2011

(54) LID STRUCTURE FOR MICRODEVICE AND METHOD OF MANUFACTURE

(75) Inventors: Steven H. Hovey, Goleta, CA (US); Hung D. Nguyen, Los Angeles, CA (US)

(73) Assignee: Innovative Micro Technology, Goleta, CA (US)

( * ) Notice: Subject to any disclaimer, the term of this patent is extended or adjusted under 35 U.S.C. 154(b) by 745 days.

(21) Appl. No.: 11/797,659

(22) Filed: May 7, 2007

(65) Prior Publication Data

US 2008/0277672 A1    Nov. 13, 2008

(51) Int. Cl.
*H01L 23/02* (2006.01)
(52) U.S. Cl. ............... 257/680; 257/E21.499
(58) Field of Classification Search ........ 438/107–116; 257/704, 774, 783, 618, 622, E21.499, 728, 257/680–684
See application file for complete search history.

(56) References Cited

U.S. PATENT DOCUMENTS

| | | | |
|---|---|---|---|
| 4,604,304 A | 8/1986 | Faraone et al. | |
| 6,010,935 A * | 1/2000 | Doan | 438/303 |
| 6,359,333 B1 * | 3/2002 | Wood et al. | 257/704 |
| 6,363,183 B1 * | 3/2002 | Koh | 385/19 |
| 6,838,306 B2 * | 1/2005 | Cole | 438/65 |
| 6,897,469 B2 * | 5/2005 | Syllaios et al. | 257/10 |
| 7,268,012 B2 * | 9/2007 | Jiang et al. | 438/106 |
| 7,276,798 B2 * | 10/2007 | Higashi et al. | 257/777 |
| 2003/0197176 A1 * | 10/2003 | Spallas et al. | 257/58 |
| 2004/0140570 A1 * | 7/2004 | Higashi et al. | 257/777 |
| 2005/0156260 A1 * | 7/2005 | Partridge et al. | 257/414 |
| 2006/0166407 A1 * | 7/2006 | Kaushal et al. | 438/115 |
| 2006/0246631 A1 * | 11/2006 | Lutz et al. | 438/127 |
| 2007/0235856 A1 * | 10/2007 | Haba et al. | 257/697 |

OTHER PUBLICATIONS

MTI (MTI corporation, product manual, Thermal oxide wafer, 2002).*

* cited by examiner

*Primary Examiner* — Matthew W Such
*Assistant Examiner* — Ali Naraghi
(74) *Attorney, Agent, or Firm* — Jaquelin K. Spong

(57) ABSTRACT

A system and a method are described for forming features at the bottom of a cavity in a substrate. Embodiments of the systems and methods provide an infrared transmitting, hermetic lid for a microdevice. The lid may be manufactured by first forming small, subwavelength features on a surface of an infrared transmitting substrate, and coating the subwavelength features with an etch stop material. A spacer wafer is then bonded to the infrared transmitting substrate, and a device cavity is etched into the spacer wafer down to the etch stop material, exposing the subwavelength features. The etch stop material may then be removed, and the microdevice enclosed in the device cavity, by bonding the device wafer to the lid.

9 Claims, 12 Drawing Sheets

LID STRUCTURE FOR MICRODEVICE AND METHOD OF MANUFACTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a system and method for creating features at the bottom of a cavity. Embodiments of this invention relate to a method for making an infrared transmitting lid for an infrared-emitting or infrared detecting device using sub-wavelength structures.

Microelectromechanical systems (MEMS) are very small, often moveable structures made on a substrate using surface or bulk lithographic processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be used to connect one or more input terminals to one or more output terminals, all microfabricated on a substrate. The actuation means for the moveable switch may be thermal, piezoelectric, electrostatic, or magnetic, for example.

MEMS may also be non-moving devices, such as photonic devices, fabricated using surface or bulk lithographic processing techniques. In such cases, small features required for the device to emit radiation in a narrow spectrum, for example, may be formed using MEMS techniques. Such a photonic device is a photonic crystal, formed from two metal films separated by a dielectric, with small holes formed in the metal films which determine the radiation output pattern and spectrum of the device. The device may be heated to an operating temperature of about 350 degrees centigrade, by driving a current through the device, and heating it by Joule heating. When the operating temperature is achieved, the photonic device may emit the desired spectrum of radiation, often in the infrared portion of the electromagnetic spectrum.

Because the device may emit radiation in the infrared portion of the spectrum, for example, at a wavelength of between about 8 um and about 12 um, it is often desirable to encapsulate the photonic device in a vacuum cavity of a lid wafer that transmits the infrared radiation. Providing the vacuum cavity may reduce the absorption losses of the radiation that might otherwise occur if a gaseous environment, such as air, surrounds the infrared device. However, in order to also reduce reflective losses from the surfaces of the vacuum cavity, it may be desirable to provide antireflective structures, such as thin optical coatings on the cavity surfaces. One option for providing such a low reflectivity vacuum cavity is to deposit an antireflective coating on the lid wafer with a lift off method. However, the lift off method may require a thick photoresist, which is hard to remove after the antireflective coating is deposited on the lid wafer, because of the very high temperatures which must be used to deposit the antireflective coating.

Another option for providing the infrared-transmitting lid is to pattern sub-wavelength structures on one or both surfaces of the lid wafer, as described in, for example, U.S. Pat. No. 6,897,469, incorporated by reference in its entirety. The subwavelength features effectively reduce the dielectric constant of the lid wafer material and thereby reduce its reflection coefficient, as described in the incorporated '469 patent. However, in order to make the subwavelength features within the device cavity of the lid wafer, a relatively deep cavity may first be formed, sufficient to clear the infrared device, and the sub-wavelength features may be formed at the bottom of this cavity. The high resolution lithography required to form these small features is difficult to accomplish when the features are located at the bottom of a cavity, because the lithography cannot be focused easily on the surface on which the features are to be formed. In addition it is very difficult to obtain a uniformly thick layer of photosensitive material when using standard coating methods in the presence of such extreme topography, and significant variations in thickness of the photosensitive material can make patterning of small features very difficult or impossible.

SUMMARY

A system and method are described for forming features at the bottom of a cavity, which avoid the above-described difficulties. The systems and methods may include forming the subwavelength features on a top surface of a first wafer, covering the subwavelength features with an etch stop material, then bonding a second, spacer wafer to the first wafer to form a lid wafer subassembly. The cavity is then formed in the spacer wafer by etching a hole through to the etch stop material, which is located on the top surface of the first wafer. The etch stop material may then be removed from the bottom of the cavity by, for example, wet etching. The lid wafer subassembly may then be used as a lid for an infrared detector or emitter, because the subwavelength features reduce the reflective losses of the lid surface to infrared radiation.

The systems and methods may be practiced using sub-wavelength features of about 1 μm to 2 μm in diameter, spaced about 3 μm apart in a close-packed hexagonal array. The subwavelength features may be about 2 μm deep, and formed on a surface of an infrared-transmissive, low oxygen, float zone silicon substrate. The subwavelength features may then be coated with a silicon dioxide thermal layer, or any other material that can provide an etch stop for the subsequent etch process. In other exemplary embodiments, the etch stop material may be gold (Au), nickel (Ni), chromium (Cr) or silicon nitride ($Si_3N_4$) tungsten, titanium or titanium-tungsten alloy. The spacer wafer may be any material in which a device cavity may be formed, such as silicon, metal, glass or pyrex. The device cavity may be made by removing the material of the spacer wafer to the etch stop material on the surface of the subwavelength features formed in the infrared-transmissive substrate.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

In the systems and methods described herein, features are formed at the bottom of a cavity by first forming the features on the surface of a wafer, and then forming the cavity through a spacer wafer bonded to the first wafer. By using the spacer wafer approach, the features may be formed on the surface of a wafer that will eventually be located at the bottom of a device cavity. However, because the features are first formed on a wafer surface, high resolution lithography may be used to create the features.

The systems and methods are described with respect to an infrared transmitting lid embodiment, intended to enclose an infrared emitting or infrared detecting microdevice. The systems and methods may include forming subwavelength features on a first wafer, covering the subwavelength features with an etch stop material, then bonding a second, spacer wafer to the first wafer to form a lid wafer subassembly. The cavity is then formed in the spacer wafer by etching a hole through the spacer wafer to the etch stop material, which is located on the top of the first wafer. The etch stop material may then be removed from the bottom of the cavity by, for example, wet etching. The lid wafer subassembly may then be used as a lid wafer for an infrared detector or emitter, because the subwavelength features reduce the reflective losses of the wafer surface to infrared radiation.

The systems and methods are described with respect to subwavelength features formed in an infrared transmitting lid, however, it should be understood that this embodiment is exemplary only, and that the systems and methods may be used to form any other features at the bottom of a cavity. For example, in one alternative embodiment, corrugations may be formed in a device cavity for deposition of a getter material, in order to increase the surface area, and therefore the gettering capability of the gettering material. Such an application is described in U.S. patent application Ser. No. 11/433,435, incorporated by reference herein in its entirety.

Figure 1:
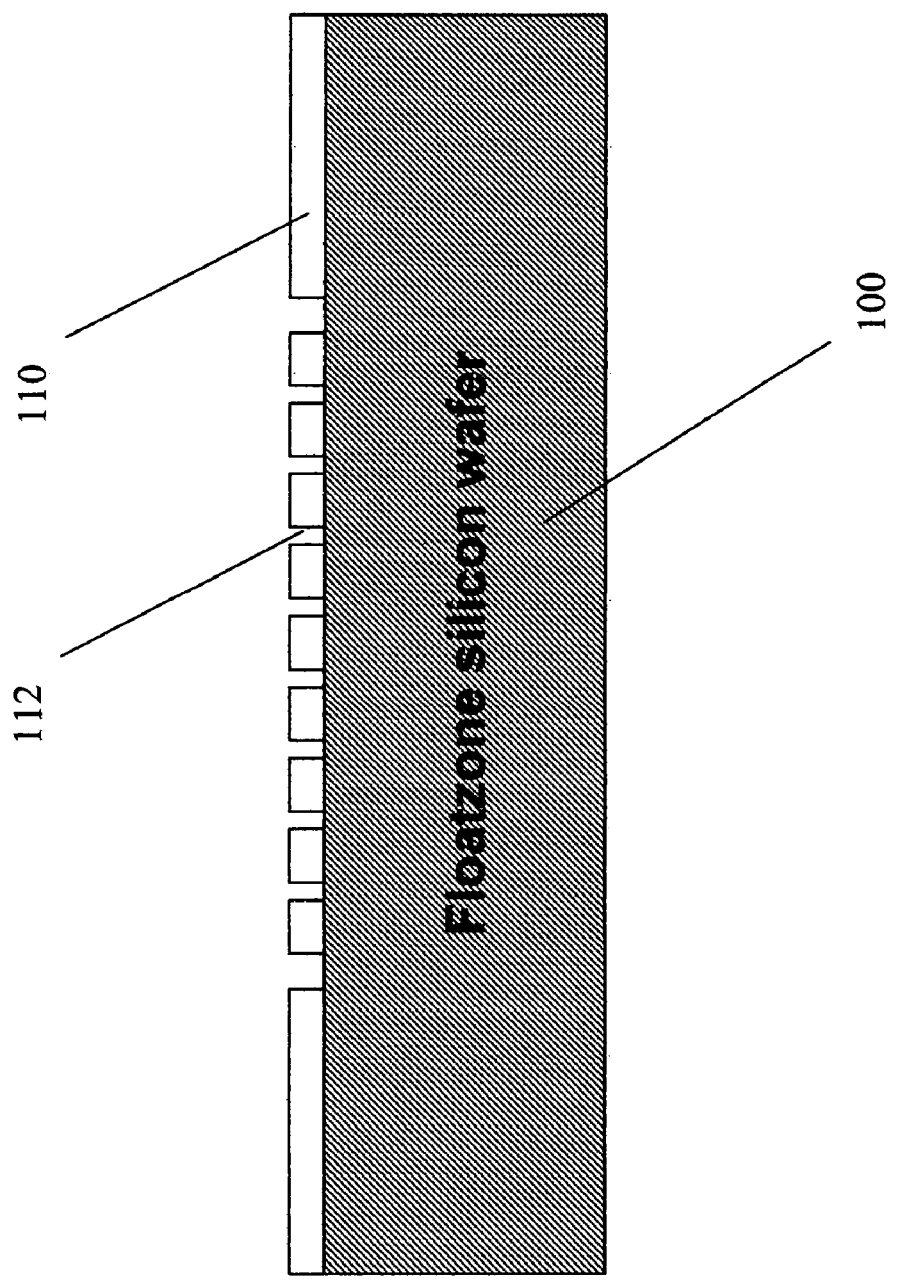
FIG. 1 is a cross sectional view of an exemplary substrate coated with patterned photoresist.
Figure 2:
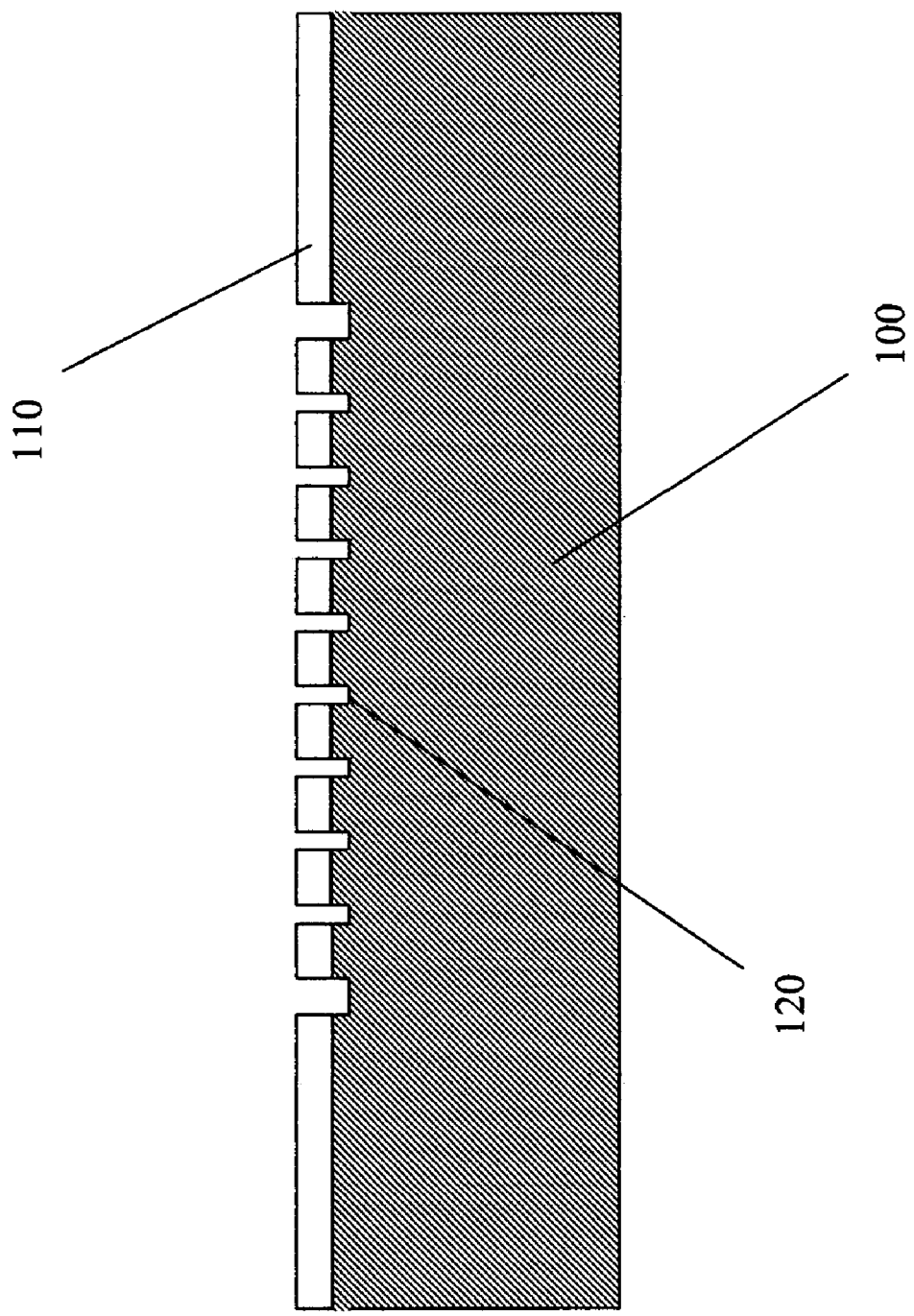
FIG. 2 is a cross sectional view of the exemplary substrate with the subwavelength features formed in the top surface of the substrate.
Figure 3:
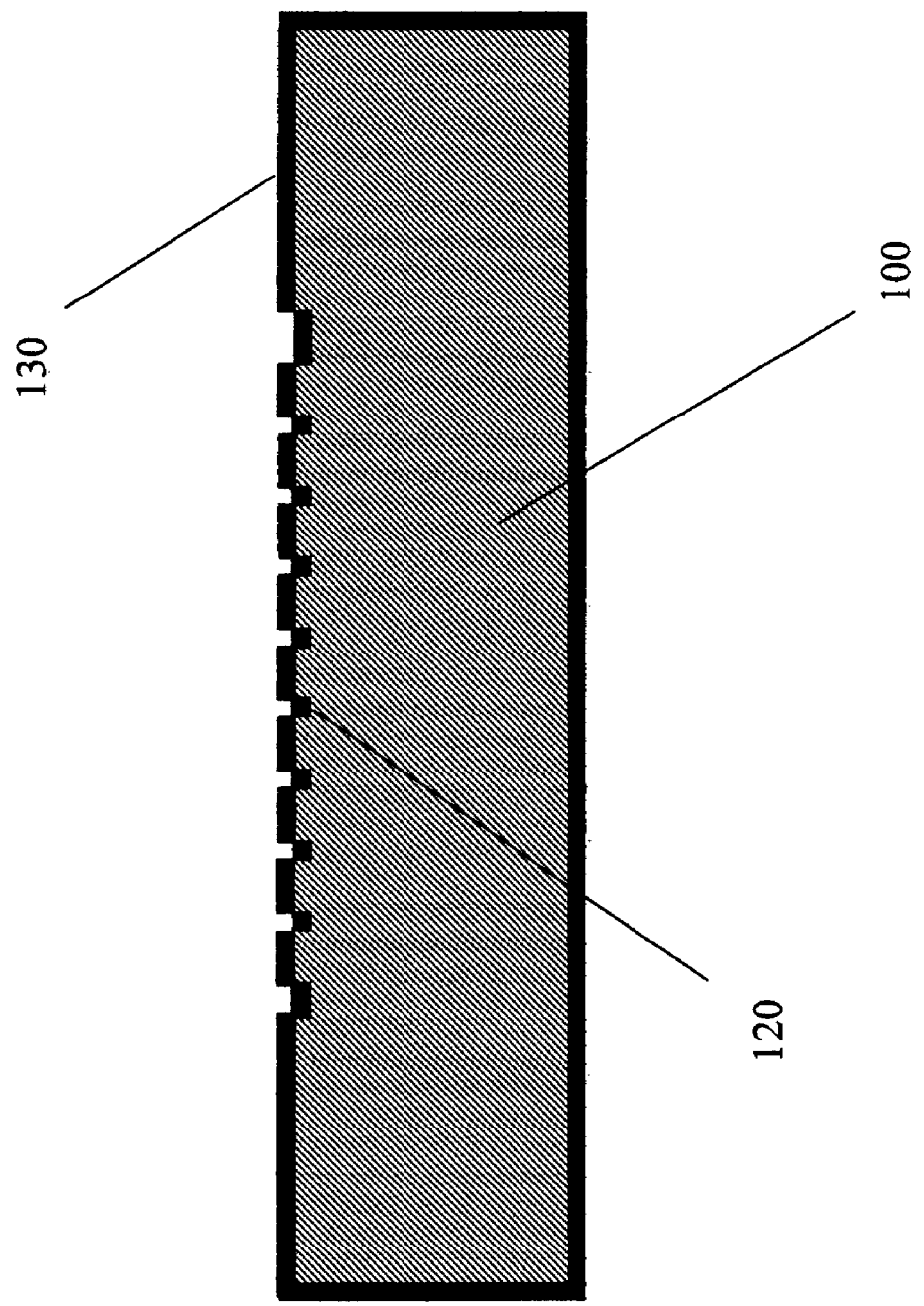
FIG. 3 is a cross sectional view of the exemplary substrate with etch stop material formed over the subwavelength features in the top surface of the substrate.

FIG. 1 shows a cross sectional view of an exemplary substrate 100, suitable for use as an infrared transmissive material. The substrate 100 may be, for example, a 500 micron thick low-oxygen float zone silicon wafer, which is substantially transmissive to radiation in the infrared portion of the electromagnetic spectrum. The terms "substantially transmissive" should be understood to mean that at least about 50% of the infrared radiation normally incident on the material is transmitted through the material, rather than being absorbed. It should be understood that although the substrate 100 may initially by 500 μm thick, the substrate 100 and/or the spacer wafer may be thinned after bonding to another wafer to any desired thickness using a grinding and/or CMP procedure In the first step of the process, illustrated in FIG. 1, the substrate 100 is covered with photoresist 110, which is then patterned with a set of openings 112 corresponding to the size and location of the subwavelength features to be formed in the substrate 100. The openings 112 may be, for example, about 1 μm to about 2 μm in diameter, and may be separated by a distance of about 3 μm. The diameter of the openings 120 is therefore substantially smaller than the wavelength of light that the surface is designed to transmit, which is about 8 μm to about 12 μm, and it should be noted that the openings 112 are not necessarily drawn to scale. The openings 112 may be arranged in a close-packed hexagonal array, although it should be understood that this embodiment is exemplary only, and that the openings may be formed in any of a number of other arrangements. The design and arrangement of such subwavelength features is described in greater detail in the incorporated '469 patent. It should be understood that the dimensions set forth above are exemplary only, and that other dimensions may be chosen depending on the requirements of the application. Although the openings 112 are described here as circular and having a characteristic diameter smaller than the wavelength of the light they are intended to transmit, it should be understood that this is only one exemplary embodiment, and that openings 112 may have any shape and size.

The silicon substrate 100 may then undergo an etching process, which removes the substrate material at the openings 112 where it is exposed by the photoresist 110. The etching process may be any of a number of commonly used techniques for the removal of material, such as deep reactive ion etching (DRIE) or reactive ion etching (RIE) to form subwavelength structures 120. The subwavelength features 120 may be formed in a deep reactive ion etcher, such as that manufactured by Surface Technology Systems (STS) of Newport, UK, for example. The subwavelength features 120 may be substantially circular depressions with a depth of about 2 μm, which may require about 1 minute of deep reactive ion etching (DRIE) or about 20 minutes of reactive ion etching (RIE). The photoresist 110 may then be stripped from the substrate 100. By forming an array of such subwavelength features, wherein a diameter of the subwavelength features is substantially smaller that the wavelength of the light it is desired to transmit, the reflectivity of the surface may be substantially reduced, as set forth in the incorporated '469 patent. As before, it should be understood that other, non-circular features may be formed using this procedure.

An etch stop material may then be formed over the subwavelength features 120. In the exemplary embodiment described here, a silicon dioxide layer 130 will serve as the etch stop material for the subsequent etching of the device cavity. However, it should be understood that this embodiment is exemplary only, and that other etch stop materials, such as gold (Au), nickel (Ni), chromium (Cr), tungsten (W), titanium (Ti), titanium-tungsten alloy (TiW), or silicon nitride ($Si_3N_4$) may be chosen, depending on the application and the technique which will be used to subsequently etch the device cavity in the spacer wafer. The only requirement for the etch stop material is that it is etched substantially less rapidly than the material which will be used in the spacer wafer, and be of sufficient thickness to withstand the etch process applied to the overlying spacer wafer, as described below. For example, using silicon dioxide as the etch stop material, the etch stop layer may be etched at a rate of less than about 0.01 μm per minute compared with the etch rate of the silicon spacer wafer, which is about 1.5 μm per minute. Accordingly, a 2 μm thick etch stop layer of silicon dioxide is sufficient to protect an underlying silicon surface when exposed to deep reactive ion etching to etch through a 500 μm spacer wafer disposed above the etch stop material.

The oxide etch stop layer 130 may be thermally grown over the surface of the substrate 100 by heating the substrate 100 in a chamber purged and then filled with oxygen. The chamber may then be heated to a temperature of between about 1000 degrees centigrade and 1200 degrees centigrade. The oxidation chamber environment may be either wet, by the introduction of steam into the oxidation chamber, or dry. As mentioned above, the oxide etch stop layer 130 may be grown to a thickness of about 2 μm, which may require about 15 hours to form in the oxidation chamber at 1000 degrees centigrade using the wet process. This oxidation step may also form a layer of thermal oxide 135 on the opposite surface 150 of substrate 100.

Figure 4:
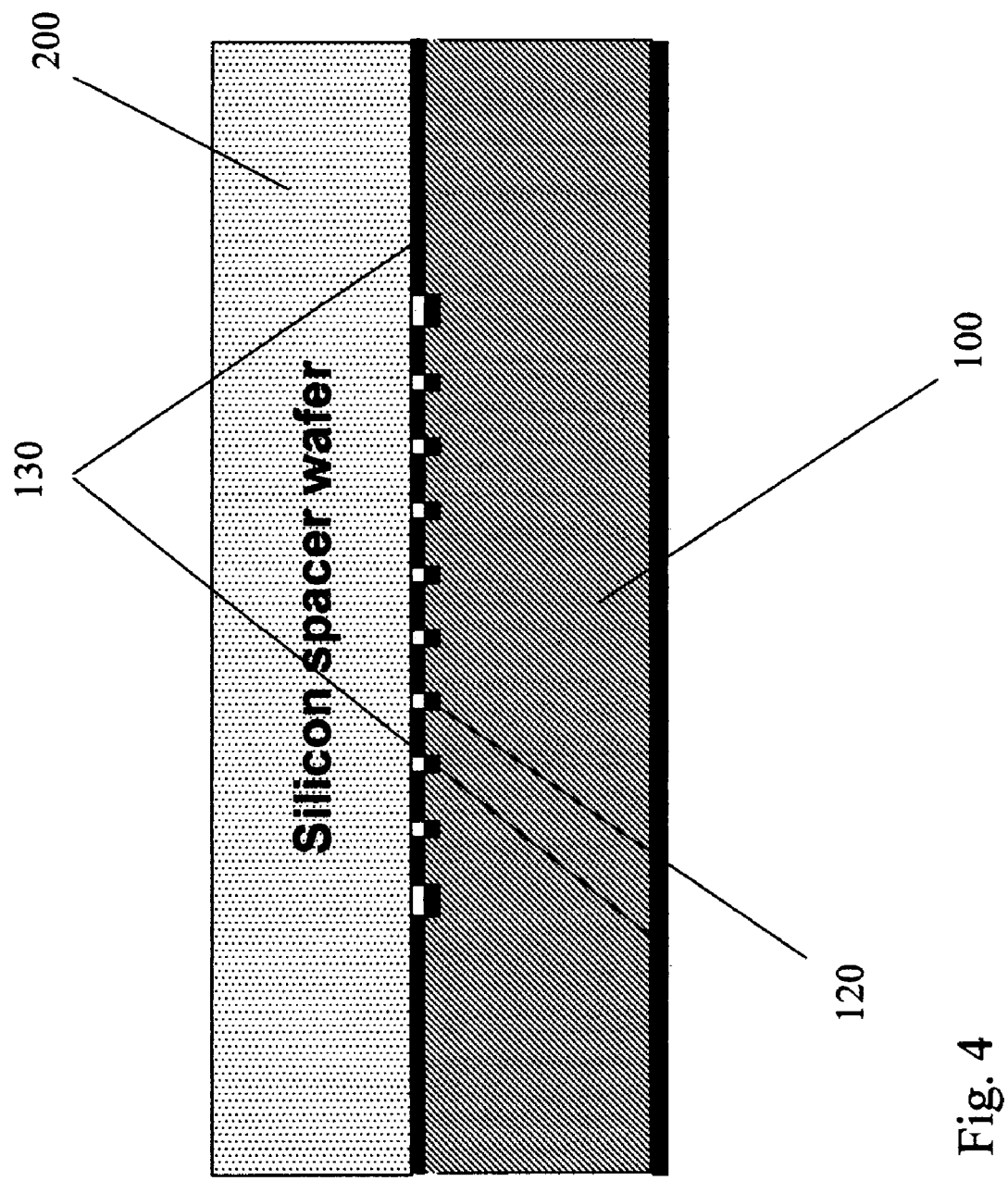
FIG. 4 is a cross sectional view of the exemplary substrate bonded to a spacer wafer to form an exemplary lid wafer subassembly.

The patterned and oxidized substrate 100 may then be bonded to a spacer wafer 200 as illustrated in FIG. 4. The spacer wafer may be any convenient substrate which can be etched, such as a standard silicon wafer, or a metal, glass or pyrex wafer. The silicon spacer wafer may be fusion bonded to the substrate 100 by placement in an inert nitrogen atmosphere, and heating to a temperature of about 1100 degrees centigrade for about 3 hours, under light pressure. If other materials are used for the spacer wafer 200, other bonding processes may be required such as adhesives appropriate for the materials.

Figure 5:
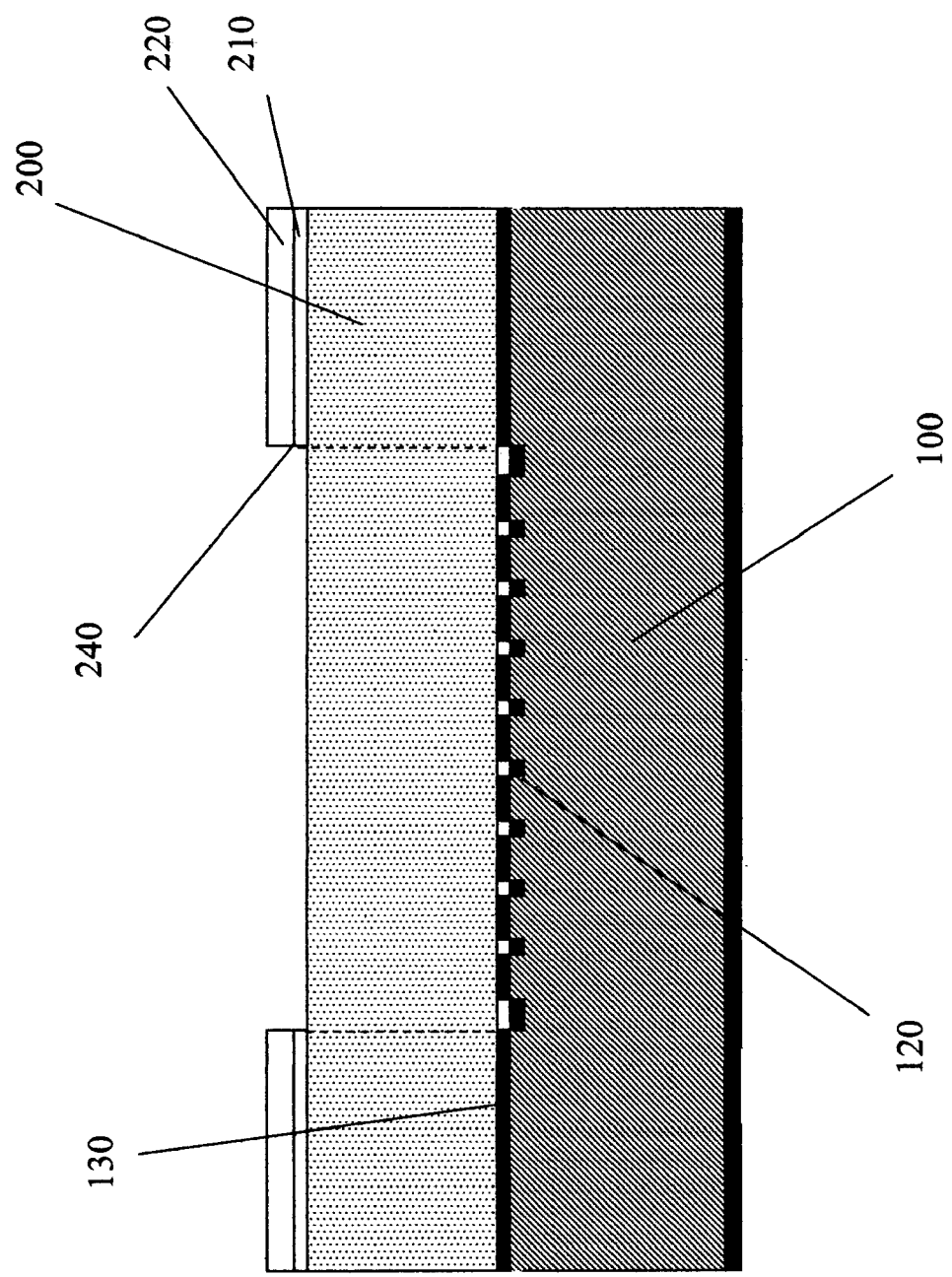
FIG. 5 is a cross sectional view of the exemplary lid wafer subassembly with a patterned hard mask before formation of the device cavity.

To form the device cavity in spacer wafer 200, a hard mask approach may be used, as shown in FIG. 5. The hard mask 220 may include a layer 210 of alumina $Al_2O_3$, about 500 Angstroms thick, which may be sputter-deposited using a standard cluster tool such as that manufactured by Veeco Instruments, Inc., of Plainview, N.Y. Alternatively, a thermally-grown silicon dioxide $SiO_2$, layer may form the hard mask for the spacer wafer 200. The alumina layer 210 may then be covered with photoresist (not shown) patterned according to the dimensions of the device cavity 240. The hard mask may then be ion milled to form openings which will correspond to the size and location of the device cavity 240. The patterned hard mask 220 is shown in cross section in FIG. 5.

In another alternative embodiment of the method, the hard mask layers 210 and 220 may be replaced with photoresist, which is patterned with an aperture corresponding to the device cavity 240. The spacer wafer may then be etched as described below. The use of photoresist may be simpler and quicker that using a hard mask, however, care must be taken to assure adhesion of the photoresist to the spacer wafer, to avoid etching unintended regions.

Figure 6:
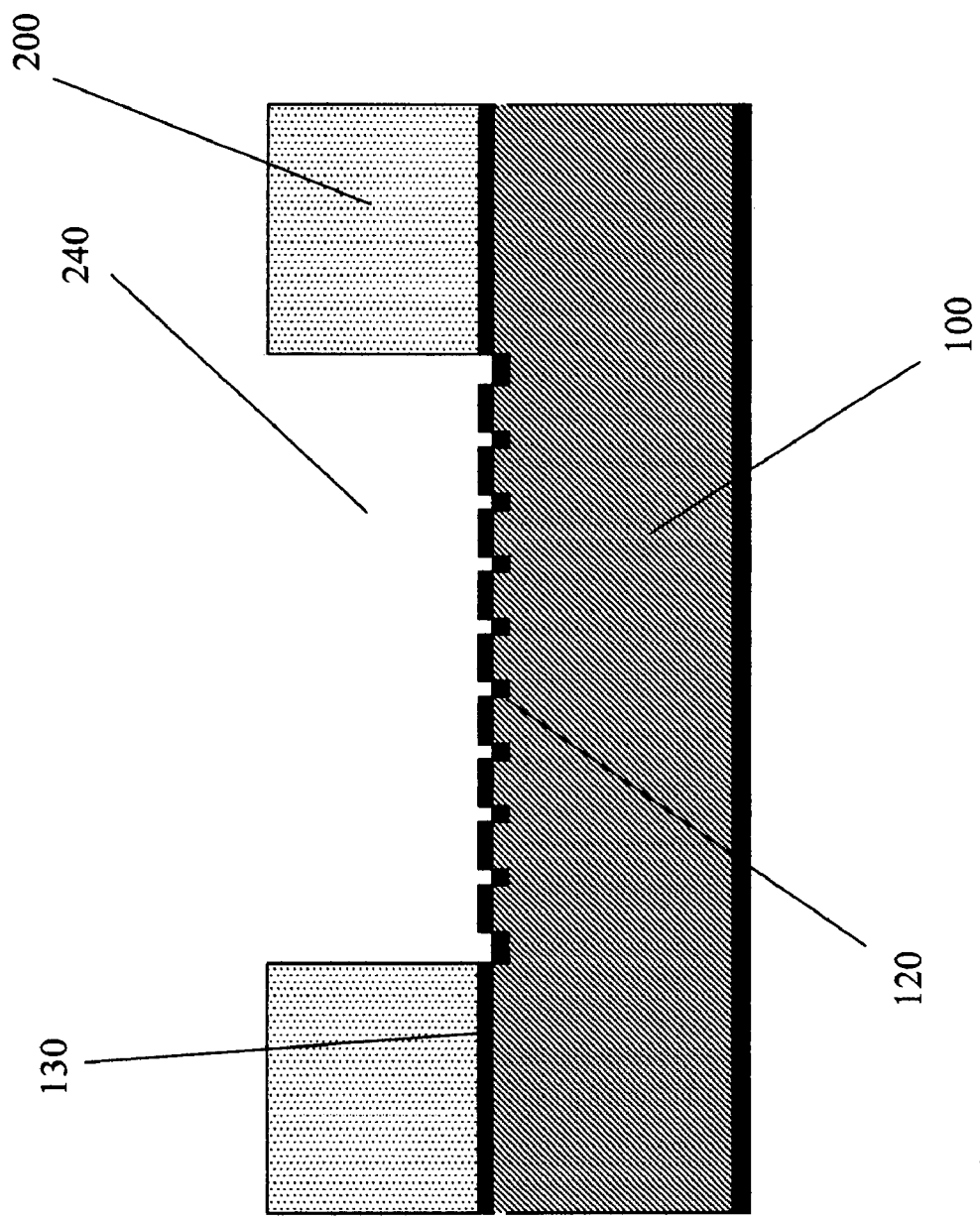
FIG. 6 is a cross sectional view of the exemplary lid wafer subassembly after formation of the device cavity.

The device cavity 240 may be formed by deep reactive ion etching (DRIE), for example, through the thickness of the spacer wafer 200. The etching may again be performed on an STS deep reactive ion etcher, and may require, for example, about 5 hours to etch through a 500 μm thick spacer wafer 200. The etching process may stop at the etch stop provided by the oxide etch stop layer 130. The 2 μm thick oxide layer 130 may be sufficient to provide the etch stop for the DRIE process, while still protecting the underlying substrate 100. If thicker or thinner spacer wafers 200 are used, the thickness of the oxide layer 130 may be adjusted appropriately, to provide a thinner or a thicker barrier against the etching process. The condition of the lid wafer subassembly after formation of the device cavity 240 is shown in cross section in FIG. 6. After completion of the etching of the device cavity 240, the hard mask layers 210 and 220, as and/or any remaining photoresist, may be removed by wet etching in an appropriate solvent such as N-methylpyrrolidone (NMP) for the photoresist, or potassium hydroxide (KOH) for alumina or buffered hydrofluoric (HF) acid for $SiO_2$, if these materials are used as a hard mask.

Figure 7:
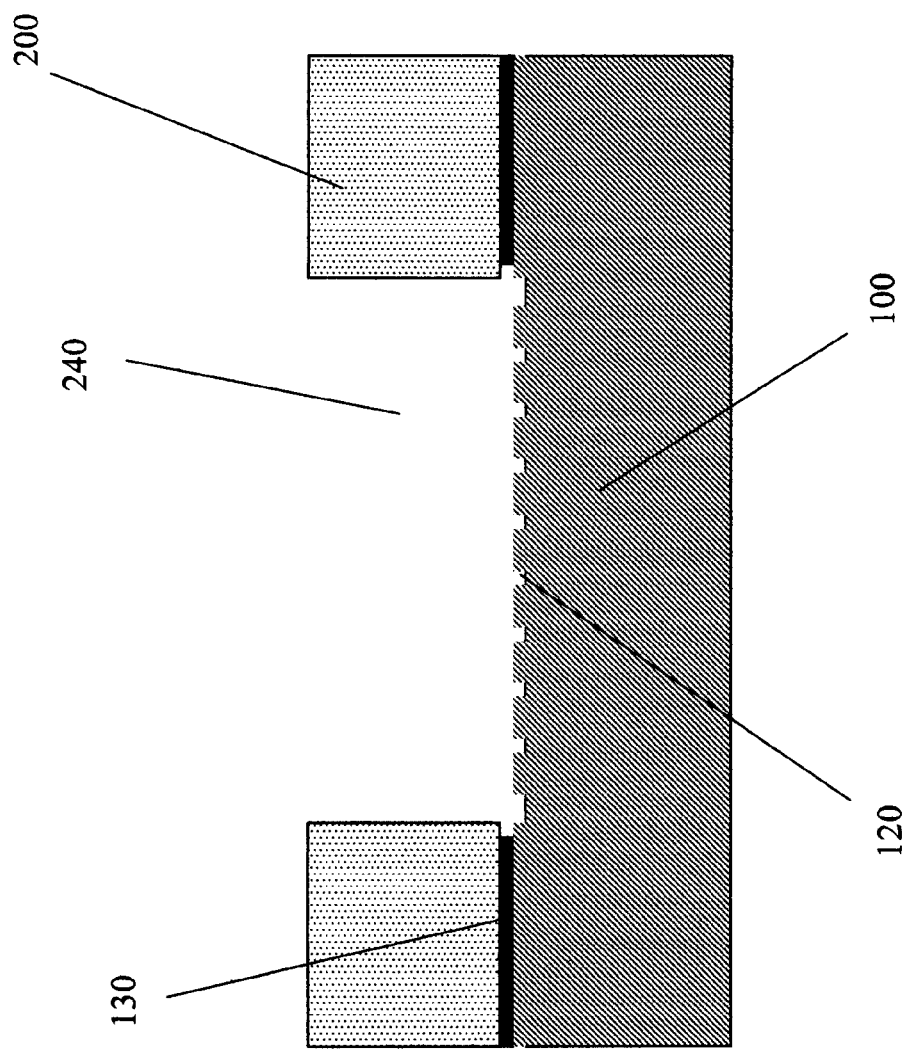
FIG. 7 is a cross sectional view of the exemplary lid wafer subassembly after removal of the etch stop material at the bottom of the device cavity.

After formation of the device cavity 240, the oxide layer etch stop material 130 may be removed from the surface of the subwavelength features 120 on substrate 100. To remove the etch stop material, the lid wafer subassembly 10 may be submerged in a liquid etchant such as a 6:1 buffered oxide etch (BOE), which is a volume ratio of six parts ammonium fluoride $NH_4F$ to one part hydrofluoric acid (HF). The etching may proceed for about 30 minutes to remove the 2 μm thick layer of $SiO_2$. This etching step may also remove the silicon dioxide layer 135 which was formed on the opposite surface 150 of substrate 100. The condition of the lid wafer subassembly 10 after removal of the etch stop material 130 is shown in FIG. 7. As shown in FIG. 7, the subwavelength features 120 are now located at the bottom of the device cavity 240. After the oxide etch stop material 130 has been removed, the lid wafer subassembly 10 may be cleaned in a Piranha bath containing $H_2SO_4$ and $H_2O_2$ to remove any remaining etchant liquid or other debris. The lid wafer subassembly 10 is then ready for bonding to a device wafer carrying the infrared emitting or infrared detecting microdevice, for example.

In an alternative embodiment, the etch stop material, such as $SiO_2$, may be applied to a surface of the spacer wafer, rather than the first substrate. The spacer wafer is then bonded to the first substrate with the subwavelength features formed therein. The rest of the process proceeds as before, with the etching of the device cavity in the spacer wafer down to the etch stop material which was applied to the surface of the spacer wafer. The etch stop material is then removed using, for example, the 6:1 buffered oxide etch (BOE), to remove a layer of $SiO_2$ which served as the etch stop material. The removal of the etch stop material then reveals the subwavelength features below it on the first substrate.

Figure 8:
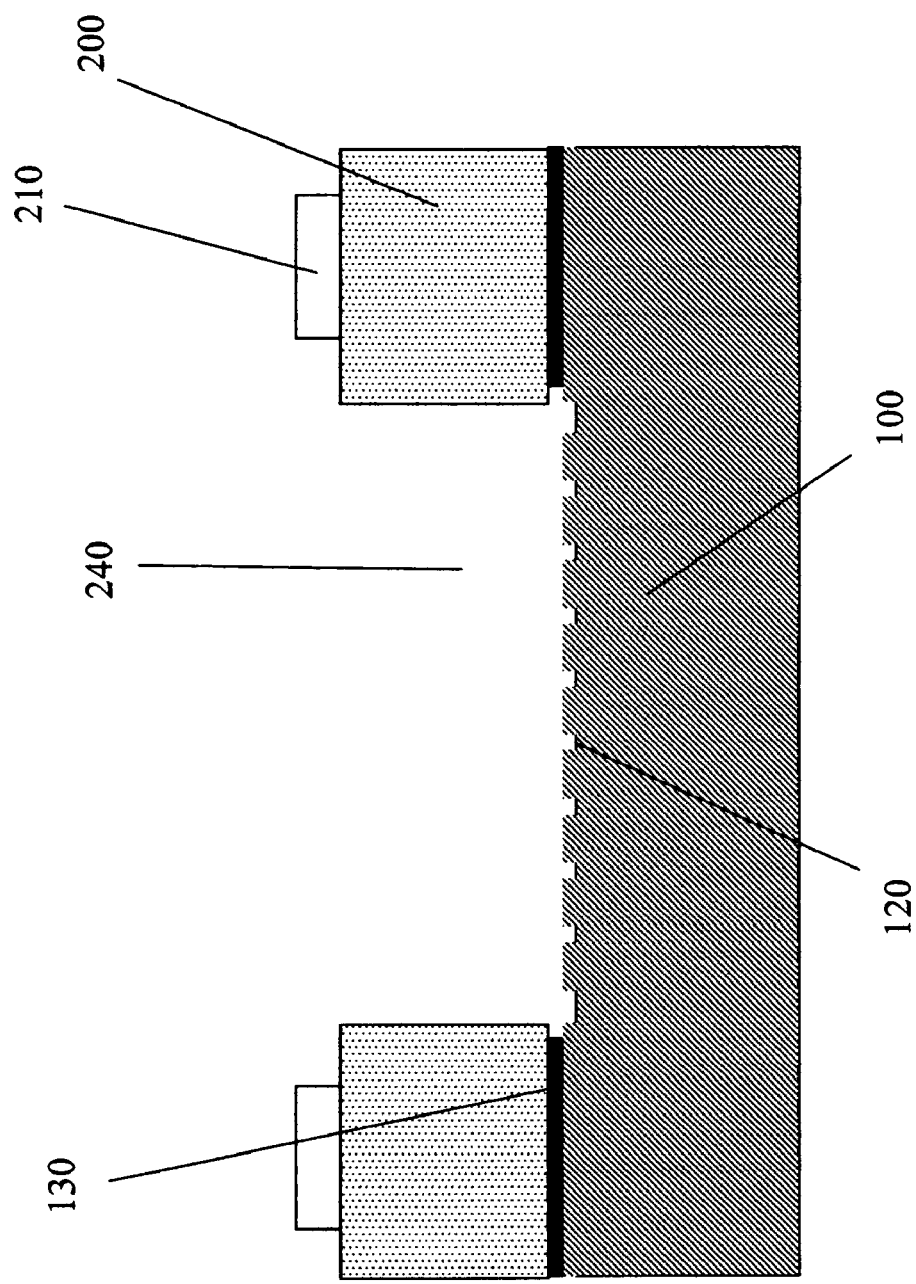
FIG. 8 is a cross sectional view of the exemplary lid wafer subassembly with adhesive applied for bonding the device wafer.

To bond the lid wafer subassembly 10 to the device wafer 300, an adhesive 210 may be deposited on the bonding surfaces of the lid wafer subassembly 10, and/or on the corresponding surfaces of the device wafer 300, as shown in FIG. 8. In various exemplary embodiments, the adhesive may be a glass frit adhesive, which may form a hermetic seal upon heating the adhesive to a temperature of about 450 degrees centigrade, which may be sufficient to melt the glass frit. The adhesive 210 may be applied using, for example, silk screening techniques which force the adhesive through carefully placed openings in a screen or stencil, and onto the bonding surfaces of the lid wafer subassembly 10. It should be understood that glass frit adhesive is only one exemplary embodiment, and that other adhesive techniques may be used, including epoxy bonding or alloy bonding, depending on the requirements of the application and the materials used. Additional details regarding the use of alternative bonding techniques are set forth in U.S. patent application Ser. No. 11/211, 611 and U.S. patent application Ser. No. 11/390,085, incorporated by reference herein in their entireties.

Figure 9:
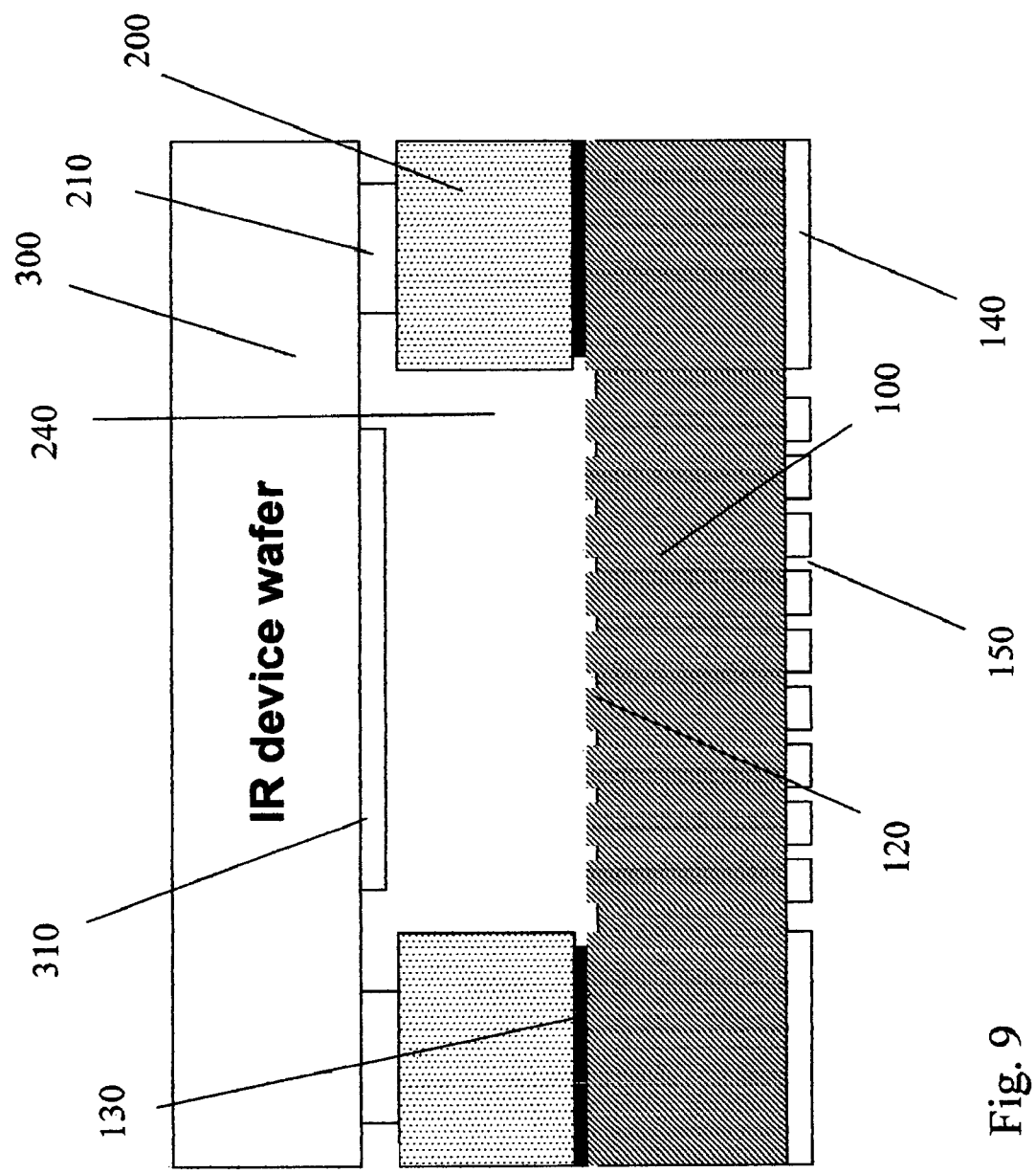
FIG. 9 is a cross sectional view of the exemplary lid wafer subassembly after bonding with the device wafer.

The lid wafer subassembly 10 may then be assembled with a device wafer 300, to form an infrared device 1000. The device wafer 300 may have infrared photonic devices 310 previously formed on its surface. The infrared photonic device 310 may be, for example, an infrared photonic crystal which emits infrared radiation in about the 3 µm to about the 5 µm region of the spectrum. The details of the fabrication of such a photonic crystal are set forth in greater detail in U.S. patent application Ser. No. 11/605,312. The wafer assembly may then be loaded into a wafer bonding chamber, in which the device wafer 300 and lid wafer subassembly 10 are pressed against one another, while the wafer bonding chamber is evacuated and the wafer assembly is heated to a temperature of about 450 degrees centigrade. At this temperature, the glass frit adhesive 210 may melt, forming a hermetic bond which may seal the vacuum environment in the device cavity 240. FIG. 9 is a cross sectional diagram illustrating the infrared device 1000 after sealing with the glass frit adhesive 210.

Figure 10:
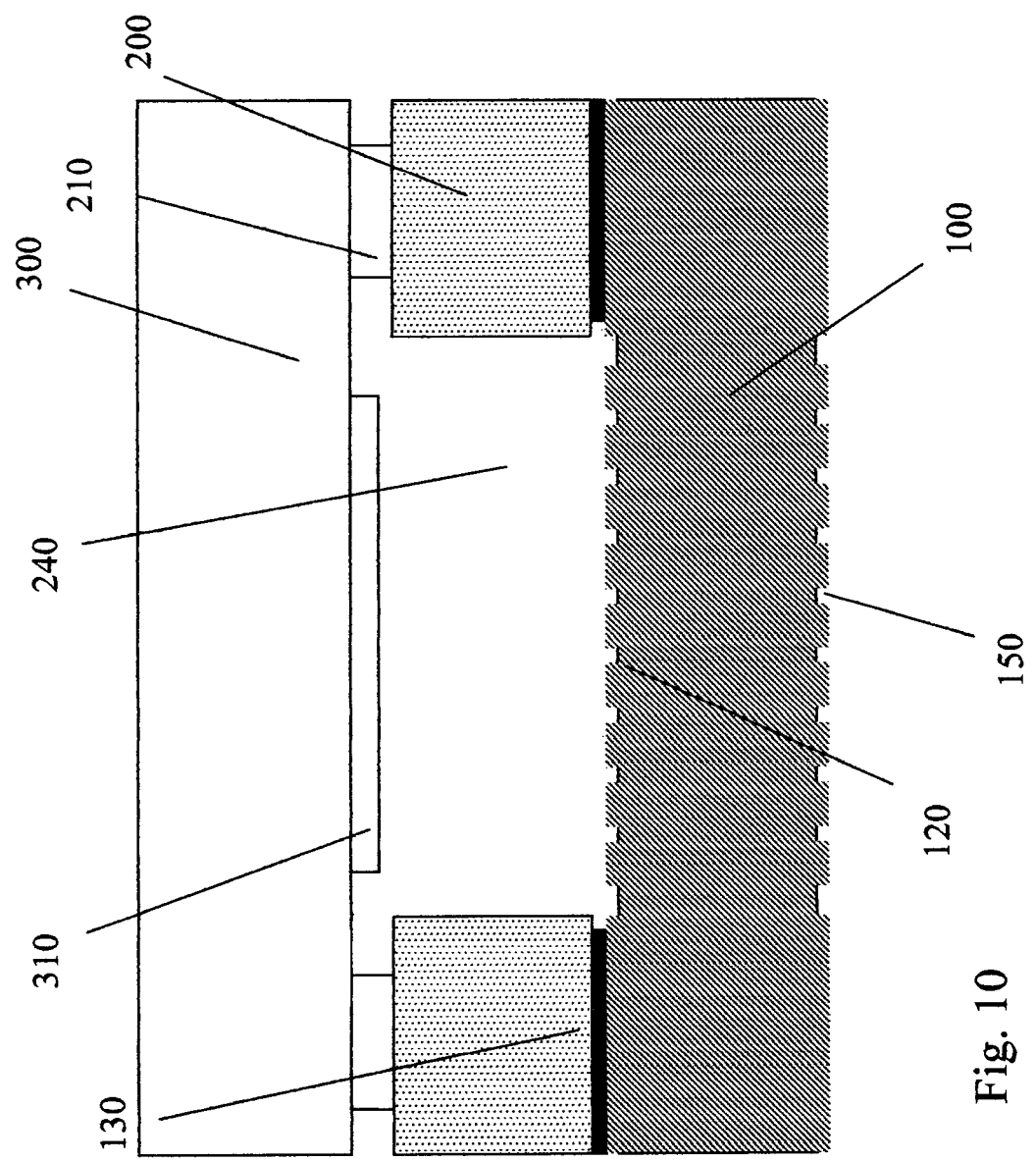
FIG. 10 is a cross sectional view of the exemplary substrate after formation of the subwavelength features on the exterior surface of the lid wafer subassembly.

It may be desirable to form additional subwavelength features 170 on an exterior surface 150 of the silicon substrate 100, to reduce the reflectivity of the exterior surface 150. To form the subwavelength features 170, the exterior surface 150 of silicon substrate 100 may be coated with photoresist 140, and the photoresist 140 may be patterned with the subwavelength feature openings 160. Corresponding features 170 may then be formed in the substrate surface 150 through openings 160 in the photoresist 140 by, for example, deep reactive ion etching, in a manner similar to the formation of subwavelength features 120 on the interior surface of the silicon substrate 100. FIG. 10 is a cross sectional diagram illustrating the condition of the infrared device 1000 after formation of the subwavelength features 170 on the exterior surface 150 of the lid wafer subassembly 10. The formation of the subwavelength features 170 on the exterior surface 150 may be the last step in the fabrication of infrared device 1000, and each of the infrared devices 1000 may now be separated from the adjacent devices.

Figure 11:
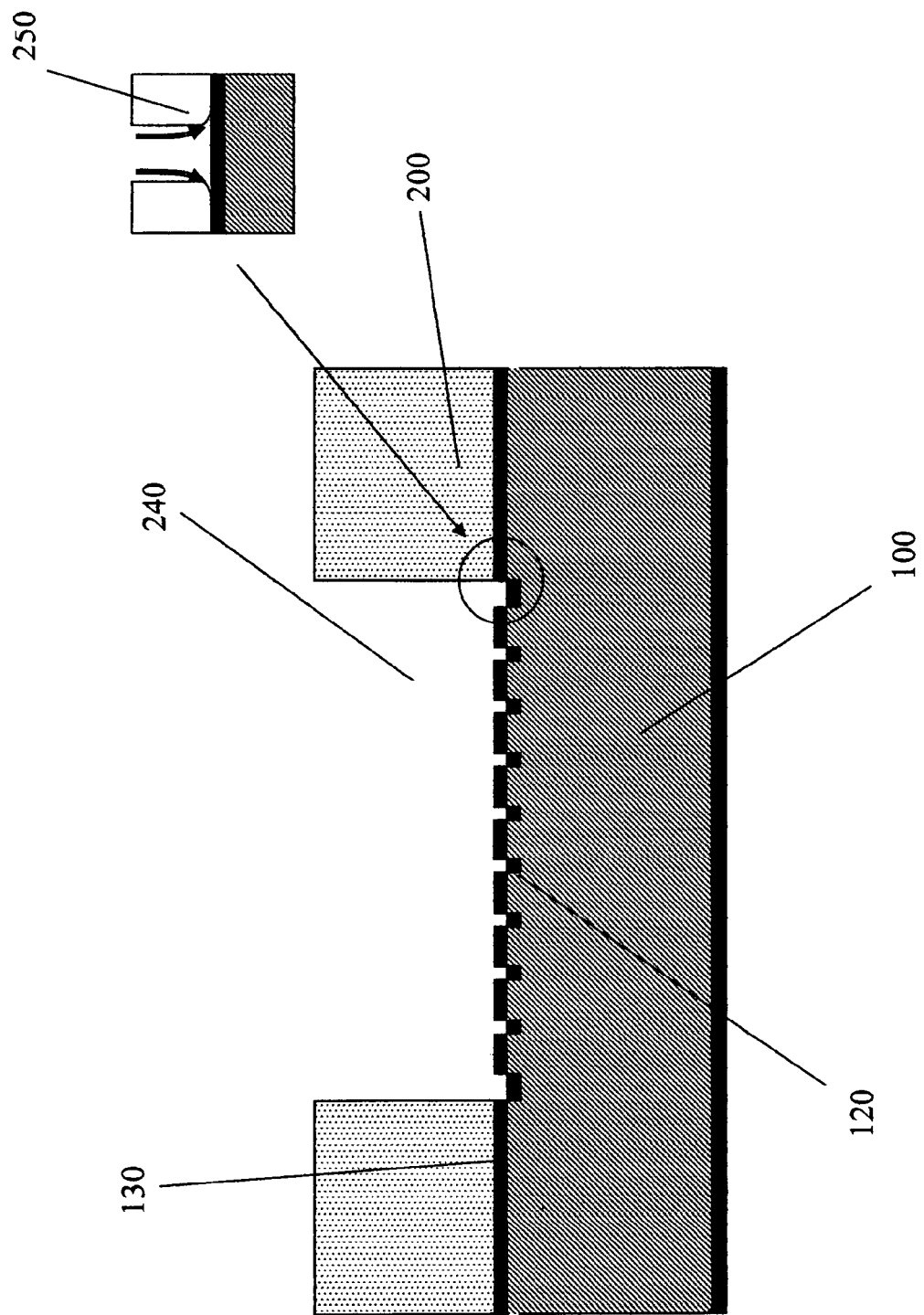
FIG. 11 is a cross sectional view of the exemplary infrared device with additional detail of the interior corner of the device cavity.

The above described method for manufacturing a lid wafer subassembly may form a structure that has at least one unique feature that may be a result of the method used to make the structure. This feature is illustrated in the cross sectional diagram of FIG. 11. The etching technique used to form the device cavity in the lid wafer subassembly may not form perfectly square corners at the bottom of the device cavity. Instead, the etching process may slightly over-etch regions 250 in the silicon dioxide etch stop material 130 that is in contact with the spacer wafer 200. Such "footing" or sideways etching may occur as a result of charge buildup in the insulating etch stop material, which deflects incoming electrons to the side. As a result, after removal of the etch stop material 130, the corner of the device cavity may have a recessed region, which is recessed from the device cavity wall 240 by an amount which depends on the depth of the device cavity. For example, for a device cavity formed through a 500 µm thick spacer wafer, the recessed region 170 is recessed by at least about 20 µm from the device cavity wall. More generally, the recessed region may be at least about 5 µm from the device cavity wall.

Figure 12:
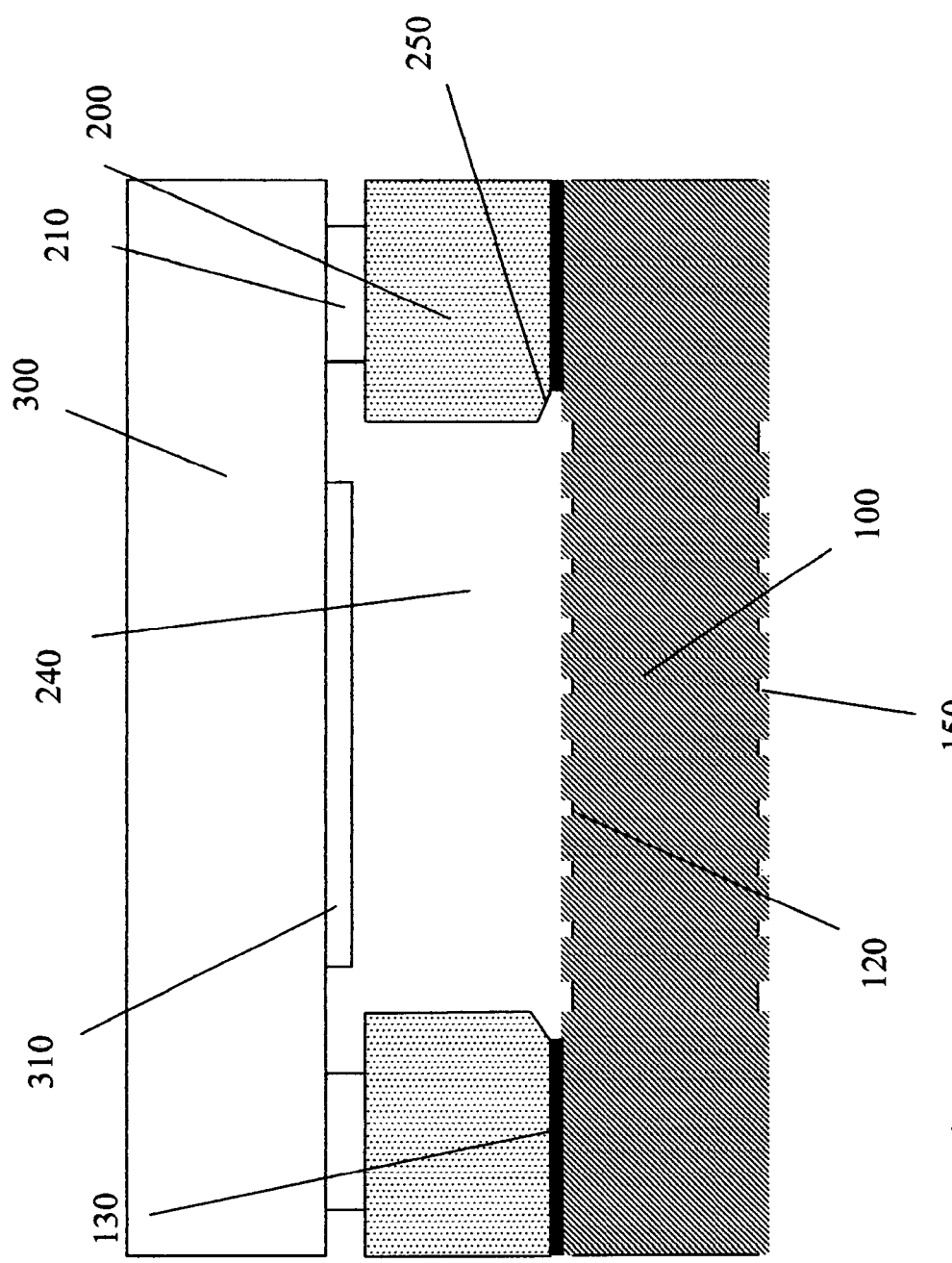
FIG. 12 is a cross sectional view of the exemplary completed device.

FIG. 12 is a cross sectional view of the lid wafer subassembly installed on an infrared device wafer 300, to form the infrared device 1000. This cross sectional view shows the recessed area 170 resulting from the etching process used to form the device cavity 240.

The following description sets forth an exemplary method for forming the lid for the infrared device. The process begins in step S100 and continues to step S200, wherein the subwavelength features are formed on a surface of an infrared transmissive substrate. In various exemplary embodiments, the infrared transmissive substrate may be low-oxygen, float zone silicon, and the subwavelength features my be holes of 1 µm to 2 µm diameter, about 2 µm deep, and separated by about 3 µm, and arranged in a close-packed hexagonal array. In step S300, an etch stop material is formed or deposited over the subwavelength features. In various exemplary embodiments, the etch stop material may be thermally grown silicon dioxide. In step S400, a spacer wafer is bonded to the infrared transmissive substrate to form a lid wafer subassembly. In step S500, a device cavity may be formed in the spacer wafer. In various exemplary embodiments, the device cavity may be formed by deep reactive ion etching through the thickness of the spacer wafer to the etch stop formed or deposited over the subwavelength features. In step S600, the lid wafer subassembly is bonded to a device wafer, which may have the infrared devices previously formed thereon. In step S700, subwavelength features may be formed on the exterior surface of the lid wafer subassembly. The devices may be singulated by sawing the wafer assembly, for example, in step S800. The process ends in step S900.

It should be understood that not all of the steps described above may be required to perform the process, and that the steps need not be performed in the order shown. For example, the subwavelength features formed on the exterior surface of the infrared transmissive substrate in step S700 may be formed before the device wafer is bonded to the lid wafer subassembly in step S600, or this step may be omitted entirely if not needed. It should also be understood that this exemplary method pertains to the formation of an infrared transmitting lid for an infrared emitting or infrared detecting microdevice, and that the method may be adapted to form other features at the bottom of a device cavity, for example, corrugation features for the deposition of a getter material.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, an exemplary lid is described which may be used in conjunction with an infrared emitting or infrared detecting microdevice. However, it should be understood that this lid is exemplary only, and that the lid technology may be applied to any of a wide variety of other microdevices. Furthermore, many of the process details may be substituted by similar or equivalent processes to form the same or similar structures. Accordingly, the exemplary implementations set forth above, are intended to be illustrative, not limiting.

What is claimed is:

1. A structure for a microdevice, comprising: a first substrate with a first plurality of features formed on a surface of the first substrate; a spacer wafer bonded to the first substrate with a cavity formed in the spacer wafer to expose at least some of the plurality of features to the environment of the cavity; and an etch stop material disposed between the first substrate and the spacer wafer; and a second substrate bonded to the first substrate and the spacer wafer, with a microdevice formed on the second substrate and disposed in the cavity of the spacer wafer.

2. The structure of claim 1, further comprising: a second plurality of features formed on an opposite surface of the first substrate, external to the cavity formed in the spacer wafer.

3. The structure of claim 1, wherein the first plurality of features are substantially circular depressions between about 1 um and about 2 um wide and about 2 um deep, arranged in a hexagonal, close-packed array.

4. The structure of claim 1, wherein one surface of the etch stop material is in a same plane as a top surface of the plurality of features formed on the surface of the substrate.

5. The structure of claim 1, wherein the etch stop material is recessed by at least about 5 um relative to a sidewall of the cavity defined by the spacer wafer.

6. The microdevice of claim 1, wherein the microdevice is at least one of an infrared emitting device and an infrared detecting device which emits or detects a wavelength of infrared radiation, and the first substrate comprises a material which is substantially transmitting to infrared radiation, and wherein the first plurality of features has a characteristic dimension smaller than the wavelength.

7. The microdevice of claim 6, wherein the etch stop material is disposed only on portions of the first substrate which are covered by the spacer wafer and wherein the etch stop material has an etch rate which is substantially slower than the spacer wafer when subjected to ion etching.

8. The microdevice of claim 1, wherein the second substrate is bonded to the structure with an adhesive that forms a hermetic seal that seals a vacuum environment within the cavity.

9. The structure of claim 1, wherein the etch stop material comprises at least one of silicon dioxide ($SiO_2$), gold (Au), nickel (Ni), chromium (Cr), titanium (Ti), tungsten (W), titanium-tungsten alloy (TiW) and silicon nitride ($Si_3N_4$).

* * * * *